(12) United States Patent
Long et al.

(10) Patent No.: US 8,165,834 B2
(45) Date of Patent: Apr. 24, 2012

(54) HIGH DENSITY METERING SYSTEM

(75) Inventors: Avery Long, Madison, AL (US); Ronald W. Carter, Murfreesboro, TN (US)

(73) Assignee: Schneider Electric USA, Inc., Palatine, IL (US)

( * ) Notice: Subject to any disclaimer, the term of this patent is extended or adjusted under 35 U.S.C. 154(b) by 0 days.

(21) Appl. No.: 12/983,530

(22) Filed: Jan. 3, 2011

(65) Prior Publication Data

US 2011/0098952 A1    Apr. 28, 2011

Related U.S. Application Data

(63) Continuation of application No. 12/145,856, filed on Jun. 25, 2008, now Pat. No. 7,865,320.

(51) Int. Cl.
*G06F 19/00* (2006.01)
(52) U.S. Cl. ......................................................... 702/61
(58) Field of Classification Search .................... 702/61, 702/64, 182–185
See application file for complete search history.

(56) References Cited

U.S. PATENT DOCUMENTS

| | | | |
|---|---|---|---|
| 4,667,152 A | 5/1987 | Hayes et al. ..................... | 324/77 |
| 5,446,682 A * | 8/1995 | Janke et al. ...................... | 702/85 |
| 5,737,231 A | 4/1998 | Pyle et al. ...................... | 364/483 |
| 5,831,550 A | 11/1998 | Sigiliao Da Costa et al. ......................... | 340/870.05 |
| 6,185,508 B1 | 2/2001 | Van Doorn et al. ............. | 702/60 |
| 2007/0069715 A1 | 3/2007 | Bruno | |

OTHER PUBLICATIONS

EPM 4000 Sub-Metering System brochure, www.GEMultilin.com (5 pages), 2007.
GE Consumer & Industrial Multilin, EPM 4000 Sub Meter Instruction Manual, Ontario, Canada (74 pages), 2007.
Veris Industries Power Monitoring Installation Guide, H8238(E) Series Multi-Circuit Meter, 2007 (7 pages.
IEEE Transactions on Instrumentation and Measurement, vol. 47, No. 1, Digital Power Metering Manifold by Chung-Ping Young and Michael J. Devaney, Feb. 1998 (5 pages).
Digital Power Metering Manifold, A Dissertation presented to the Faculty of the Graduate School University of Missouri-Columbia by Chung-Ping Young, Dec. 1997 (110 pages).
PCT International Search Report for International Application No. PCT/US/2009/047041 dated Nov. 12, 2009 (4 pages).
PCT International Written Opinion for International Application No. PCT/US2009/047041 dated Nov. 12, 2009 (6 pages).

* cited by examiner

*Primary Examiner* — Edward Raymond

(57) ABSTRACT

A method of monitoring the electrical power in multiple branch circuits of an AC electrical power distribution system comprises monitoring at least one voltage common to said multiple branch circuits using a main meter unit, monitoring currents of the multiple branch circuits using multiple current cards that receive a plurality of current inputs from current transducers in the multiple branch circuits, sampling the monitored voltage in the main meter unit and the monitored currents in the current cards multiple times in each cycle of the AC power signal, determining the magnitudes and angles of spectral components of the sampled current in the current cards, sending data representing the magnitudes and angles of at least selected spectral components from the current cards to the main meter unit, and storing the voltage samples and the magnitudes and angles of at least the selected spectral components in the main meter unit.

30 Claims, 9 Drawing Sheets

HIGH DENSITY METERING SYSTEM

CROSS REFERENCE TO RELATED APPLICATIONS

This application is a continuation of U.S. patent application Ser. No. 12/145,856, filed Jun. 25, 2008, which is hereby incorporated by reference in its entirety.

FIELD OF THE INVENTION

The present invention relates to the monitoring of an electrical power distribution system, and, in particular, to monitoring an electrical power distribution system and its multiple branch circuits where power is supplied from a main bus.

BACKGROUND OF THE INVENTION

In an electrical power distribution system with multiple branch circuits, it is desirable to monitor each branch circuit for a multitude of reasons including load management, power quality analysis, and tenant metering. Historically, each branch circuit had to be monitored by an individual meter which created redundancy in multiple meters, wires, memory, processors, communication ports, etc. High Density Metering (HDM) systems were developed to monitor power distribution systems with multiple branch circuits in a single meter and eliminate much of the redundancy. As a result, HDMs provide significant savings in material, space, and installation costs.

In designing an HDM system, the goal is to design a meter that efficiently monitors multiple branch circuits and is accurate, versatile, convenient and economical. HDMs typically have a single voltage input that is common to the power distribution system and a current input from each phase of each branch circuit being monitored. An HDM monitors the voltage and current inputs over a period of time and calculates real-time readings, demand readings, energy readings, and power analysis values. Even though all HDMs monitor the same inputs, there is a great deal of variety in the way in which HDM systems acquire data, transmit data internally, and process the data.

To design a versatile HDM, it is important to be able to acquire data from a variety of branch circuit configurations. HDMs typically only monitor branch circuits that are all the same configuration. This is problematic when a single distribution panel supplies power to a variety of single and/or poly-phase loads.

Additional limitations surrounding HDMs stem from an HDM's ability to transfer and process the acquired data. An HDM is limited in the number of branch circuits that can be monitored by its ability to transfer and/or process data. Deciding what internal communication system or processors to use in order to monitor a maximum number of circuits must be carefully balanced with the cost of implementing such components. The cost of implementation will not only include the cost of the communication system and processor, but other design considerations that will be affected, such as memory requirements, wiring, and the overall size of the HDM.

To achieve the goals of designing an HDM, it is important to have an efficient method of acquiring, transmitting, and processing data within an HDM. The present invention is directed to satisfying this and other needs.

SUMMARY OF THE INVENTION

According to one embodiment, a method of monitoring the electrical power in multiple branch circuits of an AC electrical power distribution system comprises monitoring at least one voltage common to said multiple branch circuits using a main meter unit, monitoring currents of the multiple branch circuits using multiple current cards that receive a plurality of current inputs from current transducers in the multiple branch circuits, sampling the monitored voltage in the main meter unit and the monitored currents in the current cards multiple times in each cycle of the AC power signal, determining the magnitudes and angles of spectral components of the sampled current in the current cards, sending data representing the magnitudes and angles of at least selected spectral components from the current cards to the main meter unit, and storing the voltage samples and the magnitudes and angles of at least the selected spectral components in the main meter unit. In one implementation, only the spectral components that have magnitudes exceeding a predetermined value are sent to the main meter unit.

The main meter unit preferably determines the magnitudes and angles of spectral components of the sampled voltage and stores data representing said magnitudes and angles of the voltage spectral components in the main meter unit.

Additionally, the main meter unit preferably stores data characterizing system voltage type, current transducers, and branch circuit configurations of the power distribution system, so that the main meter unit can calculate the power consumed in each branch circuit using the stored characterizing data along with the stored voltage and current spectral components.

The foregoing and additional aspects of the present invention will be apparent to those of ordinary skill in the art in view of the detailed description of various embodiments, which is made with reference to the drawings, a brief description of which is provided next.

BRIEF DESCRIPTION OF THE DRAWINGS

The foregoing and other advantages of the invention will become apparent upon reading the following detailed description and upon reference to the drawings.

DETAILED DESCRIPTION OF THE ILLUSTRATED EMBODIMENTS

Although the invention will be described in connection with certain preferred embodiments, it will be understood that the invention is not limited to those particular embodiments. On the contrary, the invention is intended to cover all alternatives, modifications, and equivalent arrangements as may be included within the spirit and scope of the invention as defined by the appended claims.

Figure 1:
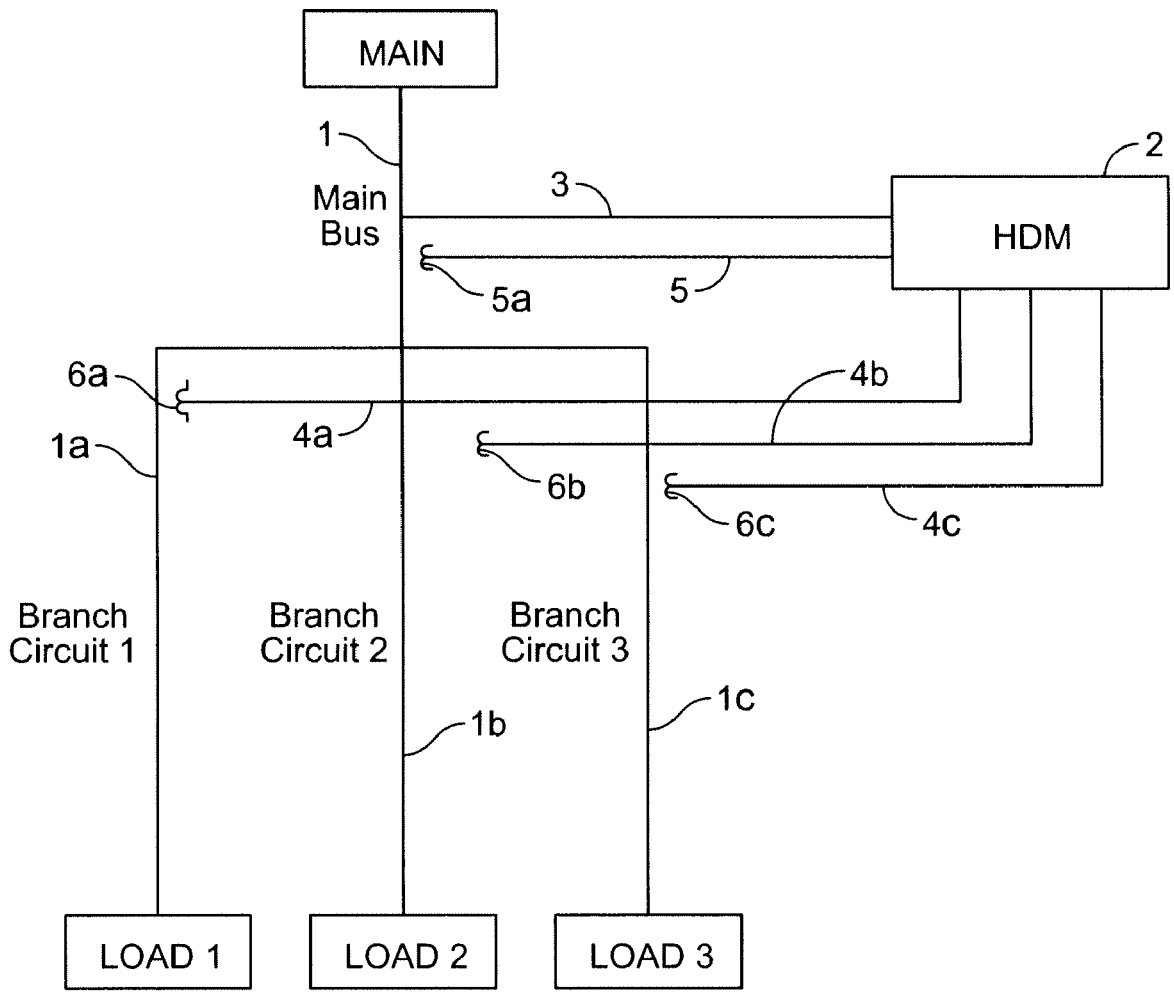
FIG. 1 is a functional block diagram of a power distribution system being monitored by a HDM.

FIG. 1 is a simplified configuration of an electrical power distribution system fed from a main bus 1 with multiple branch circuits 1a, 1b, 1c and monitored by a High Density Meter (HDM) 2. The HDM 2 is a power meter that meters the main bus 1 and all branch circuits and is compliant with ANSI C12.16. 1.0, ANSI C12.20. 0.5, and IEC62053-21 and IEC62053-23 Class 1. The HDM 2 monitors (1) the instantaneous voltage common to the power distribution system via line 3 and (2) the instantaneous current of the main bus 1 via line 5 and current transformer (CT) 5a. The HDM 2 also monitors the instantaneous current for each individual branch circuit via lines 4a, 4b, 4c and CTs 6a, 6b, 6c. The HDM 2 is able to monitor a combination of branch circuit configurations including single phase circuits or poly-phase circuits such as three-wire and four-wire circuits.

Figure 2:
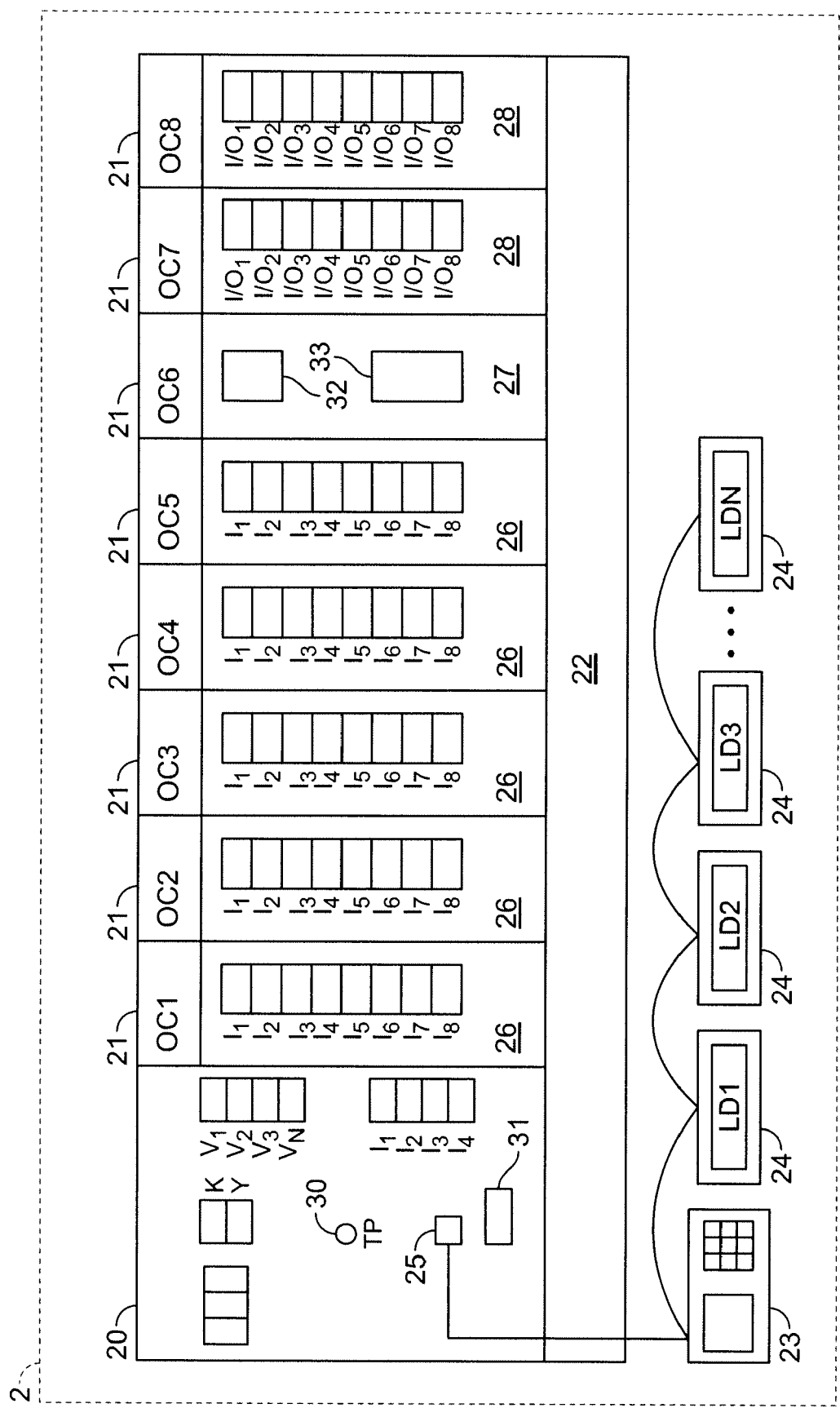
FIG. 2 is a diagrammatic illustration of the HDM in FIG. 1.

Turning next to FIG. 2, the HDM 2 includes a Main Meter Unit (MMU) 20, eight option cards 21 labeled OC1-OC8, a backplane 22, a user interface 23, and "listener" displays 24. The MMU 20 and the option cards 21 are housed in a single unit or assembly and connected along a common backplane 22. The user interface 23 and listener displays 24 are daisy chained together and connected to the MMU 20 via a user interface port 25 using an RS-485 cable. The MMU 20 is a standalone meter that monitors the voltage and current of the main bus 1 and has the same basic functionality of a PowerLogic® PM800 series power meter or equivalent meter. The MMU 20 is also able to meter multiple branch circuits by storing branch circuit parameters and acquiring time-coincident spectral component data for each branch circuit, as explained in greater detail below. The option cards 21 are interchangeable modular components that include such options as Current Cards (CCs) 26, advanced communication cards 27, I/O cards 28, logging cards, etc. The CCs 26 work in conjunction with the MMU 20 to monitor the current in the multiple branch circuits. The CCs 26 are dedicated to acquiring current data for the branch circuits and manipulating that data. FIG. 2 shows one embodiment of an HDM 2 where the option cards 21 include five CCs 26, an advanced communication card 27, and two I/O cards 28.

Figure 3:
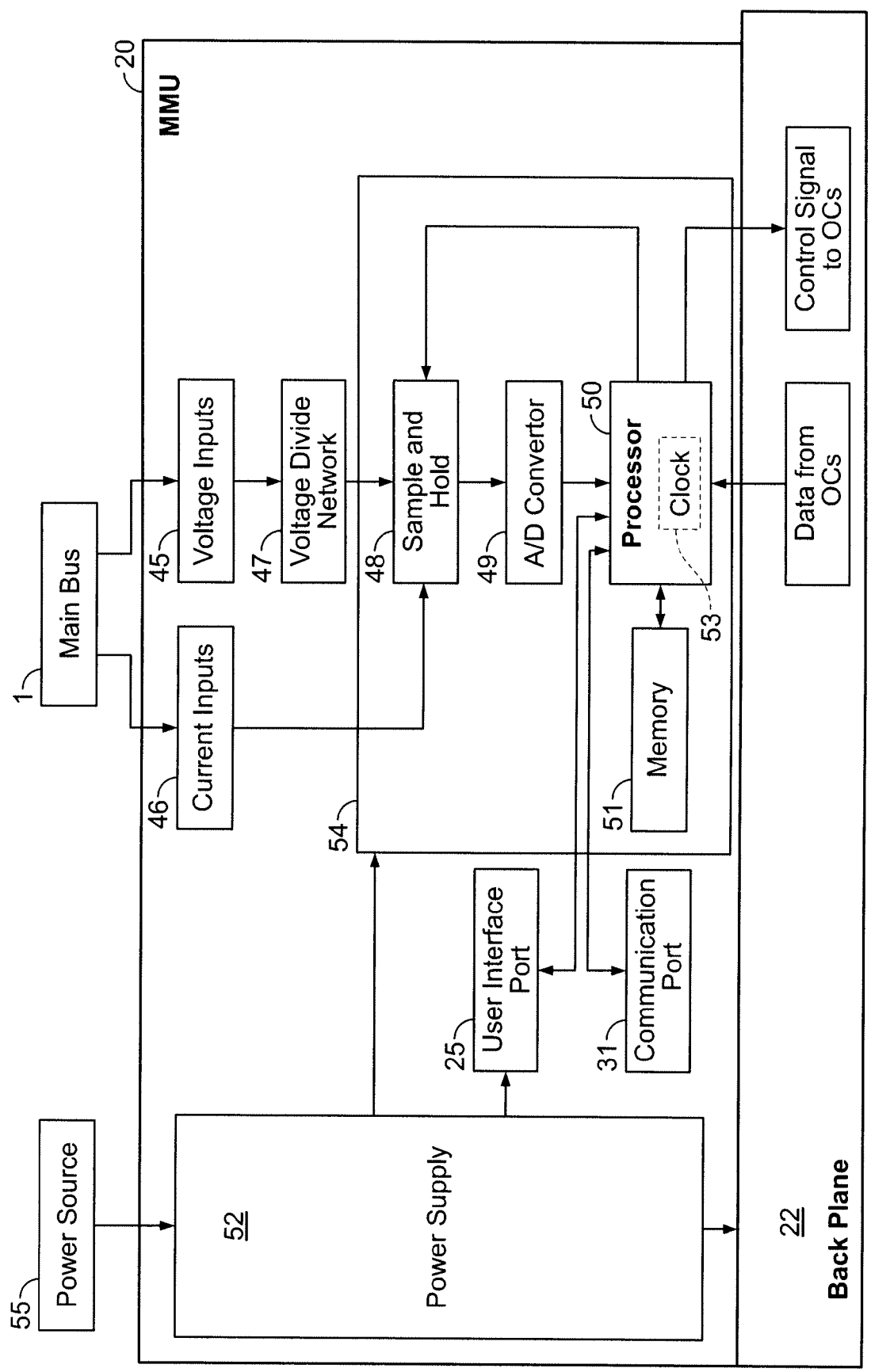
FIG. 3 is a block diagram of an MMU included in the HDM of FIGS. 1 and 2.

Referring to FIG. 3, the MMU 20 includes voltage inputs 45, current inputs 46, a voltage divide network 47, a sample and hold circuit 48, an Analog-to-Digital (A-to-D) converter 49, a microprocessor 50, memory 51, a communication port 31, a user interface port 25, and a power supply 52.

Figure 4:
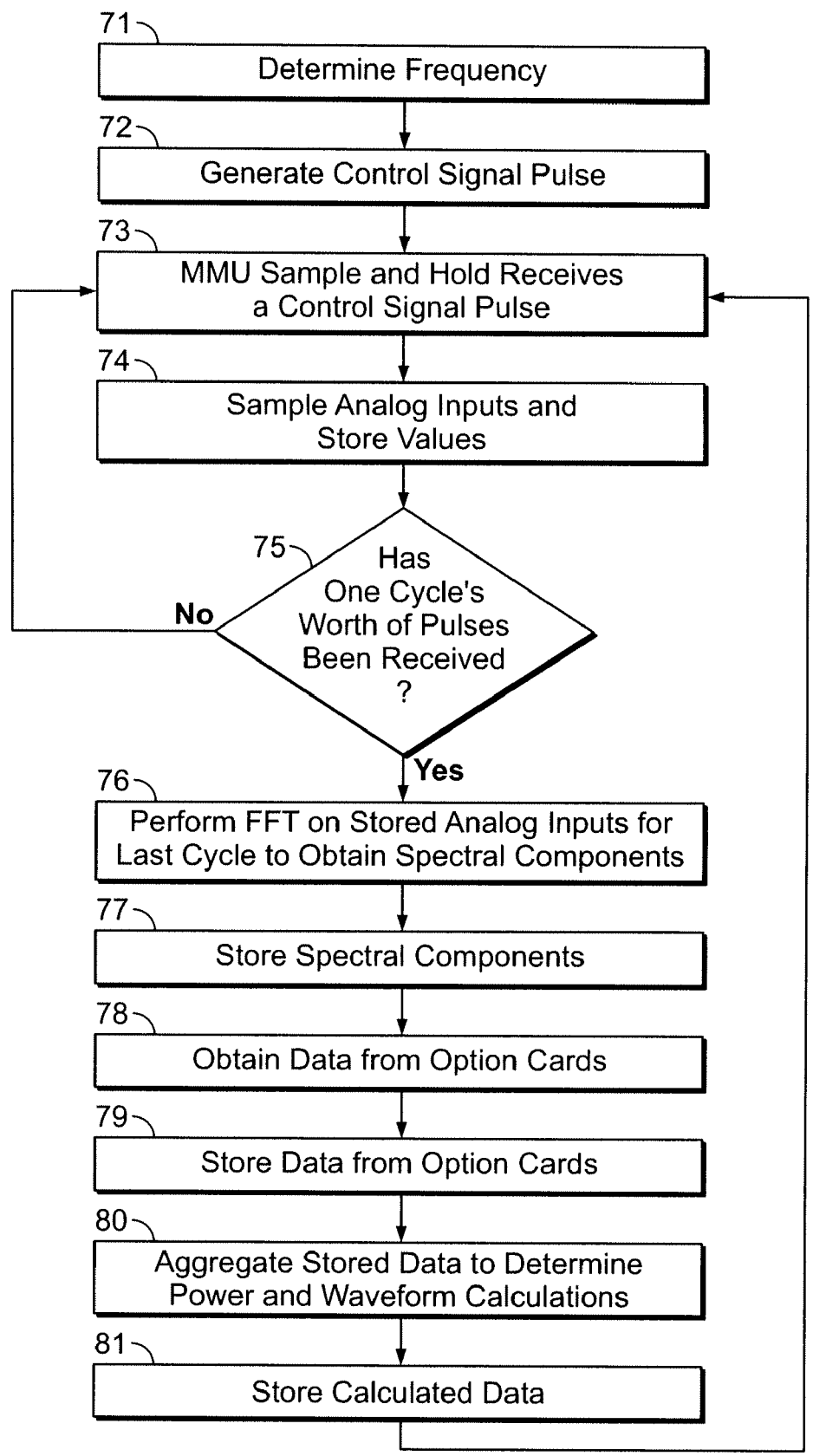
FIG. 4 is flow chart of the general operation of the MMU of FIG. 3.

The flow chart in FIG. 4 shows how the MMU 20 operates as part of the HDM 2. In step 71, the MMU 20 determines the frequency of the power distribution system. To determine the frequency, the MMU 20 microprocessor 50 employs a zero mean crossing technique based on the voltage of the power distribution system as monitored by the voltage inputs 45. In step 72, the MMU 20 generates a sampling strobe control signal that contains 128 pulses per cycle of the voltage fundamental, based on the frequency, to take time-coincident samples of (1) the voltage input common to the power distribution system and (2) current inputs for the main and all branch circuits. To acquire time-coincident data samples, the control signal is distributed and received by the MMU's sample and hold circuit 48 in step 73. The control signal is also distributed to the option cards 21 via the backplane 22.

In step 74, the MMU 20 samples the MMU's voltage and current inputs of the main bus 1 and stores the values in the MMU's memory 51. Each rising edge of a control signal pulse initiates the sampling of the analog voltage inputs 45 and current inputs 46 in the MMU's 20 sample and hold circuit 48. These values are passed through an A-to-D converter 49 before they are sent to the microprocessor 50.

Referring again to FIG. 3, the MMU voltage inputs 45 are derived from the main bus 1. The MMU voltage inputs 45 require 0-600 Vac line-to-neutral. For system voltages greater than this range, voltage transducers such as potential transformers can be used to bring the voltages into an acceptable voltage input range. The voltage inputs 45 are connected to a voltage divide network 47, formed with suitable resistors, to attenuate or scale down the voltage to an acceptable level for the integrated circuit components 54 of the MMU 20.

The MMU current inputs 46 are derived from the currents of the main bus 1. The currents in the main bus 1 conductors are measured by current transducers such as current transformers. The current transducers are sized according to the total rating of the distribution system and the maximum rating of the MMU's current inputs 46.

In step 75 of FIG. 4, the MMU 20 determines whether 128 samples of each voltage and current analog input has been stored. If not, the MMU 20 receives additional control signal pulses and continues to sample all analog inputs. When 128 samples of each voltage and current analog input (one cycle's worth of samples) has accumulated, the MMU's microprocessor 50 performs a Fast Fourier Transform (FFT) on the sampled data over the previous cycle to compute the magnitudes and angles of the spectral (harmonic) components, in step 76. The computed spectral component values are then stored in the MMU's memory 51 in step 77.

Next, in steps 78 and 79, the MMU 20 obtains data from the option cards 21 for the previous cycle, the last 128 samples, and stores the data in memory 51, as will be explained in greater detail below.

The MMU 20 aggregates all the stored time-coincident voltage and current spectral component magnitude and angle values for the main bus 1, and option card 21 data, with stored circuit configurations in step 80. The MMU 20 performs power and waveform calculations for the main circuit and all branch circuits. The calculations performed by the MMU 20 calculate each circuit's real-time readings, demand readings, energy readings, and power analysis values. Table 1 below is a list of the readings available for each circuit. The MMU 20 stores the results of all calculations for each circuit in step 81.

TABLE 1

| Real-Time Readings | Energy Readings |
|---|---|
| Current (per phase, N, G, 3-Phase) | Accumulated Energy, Real |
| Voltage (L-L, L-N, N-G, 3-Phase) | Accumulated Energy, Reactive |
| Real power (per phase, 3-Phase) | Accumulated Energy, Apparent |
| Reactive Power (per phase, 3-Phase) | Bidirectional Readings |
| Apparent Power (per phase, 3-Phase) | Reactive Energy by Quadrant |
| Power Factor (per phase, 3-Phase) | Incremental Energy |
| Frequency | Conditional Energy |
| Temperature (internal ambient) | |
| THD (current and voltage) | |
| K-Factor (per phase) | |

| Demand Readings | Power Analysis Values |
|---|---|
| Demand current (per phase present, 3-Phase average) | Crest Factor (per phase) |
| Demand Voltage (per phase present, 3-Phase average) | Displacement Power Factor (per phase, 3-Phase) |
| Average Power Factor (3-Phase total) | Fundamental Voltages (per phase) |
| Demand Real power (per phase present, peak) | Fundamental Currents (per phase) |
| Demand Reactive Power (per phase present, peak) | Fundamental Real power (per phase) |
| Demand Apparent power (per phase present, peak) | Fundamental Reactive Power (per phase) |
| Coincident Readings | Harmonic Power |

| TABLE 1-continued | |
| --- | --- |
| Predicted Power Demand | Unbalance (current and voltage) |
| | Phase rotation |
| | Harmonic Magnitudes and |
| | Angles Sequence Components |

Figure 5:
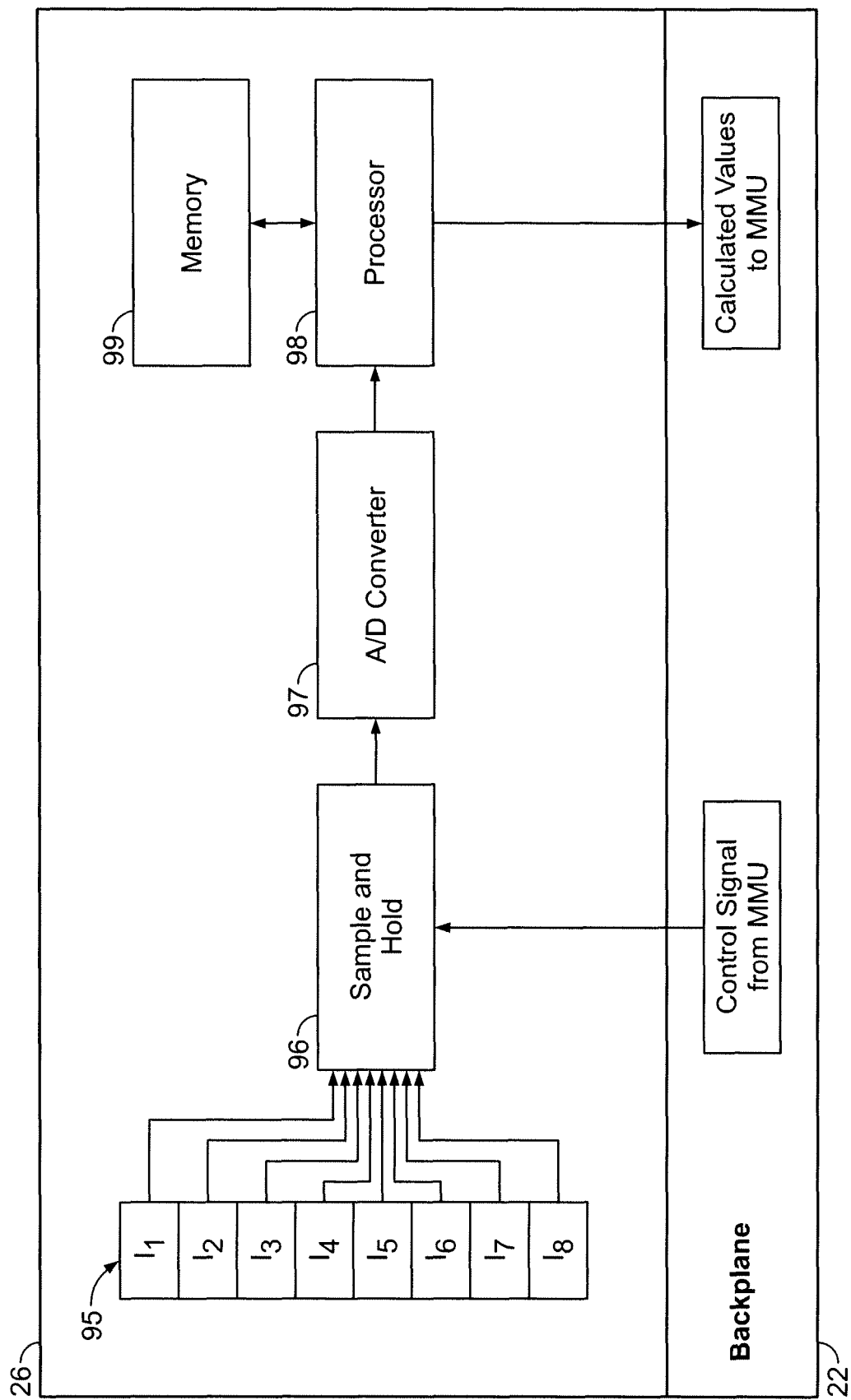
FIG. 5 is a block diagram of a CC included in the HDM of FIGS. 1 and 2.

Referring to FIG. 5, each CC 26 comprises eight current inputs 95, a current sample and hold 96, an A-to-D converter 97, a microprocessor 98, and memory 99.

Figure 6:
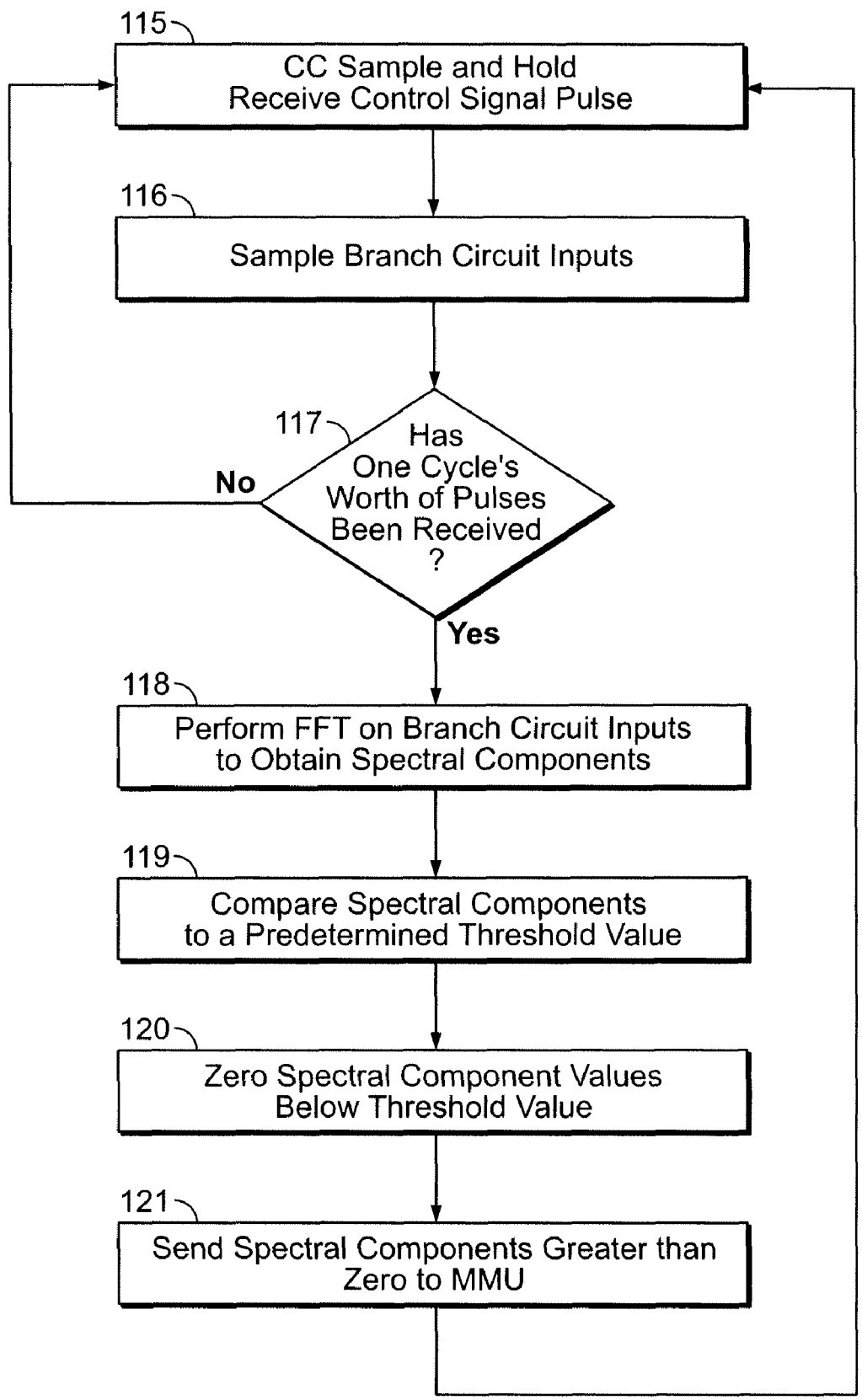
FIG. 6 is flow chart of the general operation of the CC of FIG. 5.

Each individual CC 26 operates as shown in the flowchart in FIG. 6 to acquire, manipulate, and transmit current data. In step 115, the CC 26 receives a control signal pulse generated by the MMU 20 and transmitted to the CC's sample and hold circuit 96 via the backplane 22. In step 116, the rising edge of a control signal pulse initiates time-coincident current data samples from the current inputs 95 in the sample and hold circuit 96. The A-to-D converter 97 converts the sampled analog inputs to digital signals that are sent to the CC's microprocessor 98.

An individual CC 26 has eight current inputs 95, labeled I1-I8, each of which receives the output of a current transducer. A current transducer measures the current of a branch power conductor to which it is coupled. Typically a current transducer comprises a current transformer. The CC 26 processes each input separately, and each input corresponds to a specific register in the MMU 20 memory 51.

Step 117 determines when all the samples for one cycle have been accumulated. In step 118, the CC's microprocessor 98 performs an FFT on the sampled data from the latest complete cycle, to compute the magnitude and angles of the spectral (harmonic) components of the sampled currents. Since the MMU 20 is accumulating 128 samples per cycle, per the Nyquist theorem, the CC 26 calculates a total of 64 spectral components for each input. By calculating the spectral components of the branch circuit currents in the CCs 26, considerable processor burden is relieved from the MMU's microprocessor 50.

The magnitude of each spectral component is compared with a threshold value in step 119. A typical threshold value to compare each spectral component to is five percent of the magnitude of the fundamental. In step 120, the spectral components that are below the threshold value have magnitudes set to zero, thus creating a dead-band that extends from zero up to the threshold value.

Data representing the spectral components whose magnitudes are greater than zero are transferred to the MMU 20 in step 121, and stored in the MMU's memory 51. Data representing the magnitudes and angles of the spectral components can be in either rectangular or polar form. With the majority of the spectral content for a power signal in the lower harmonics, creating a dead-band significantly reduces the amount of data that needs to be processed by the MMU 20, thus relieving processor burden in the MMU 20, because the MMU 20 does not have to calculate the zero values. By only transmitting data representing the spectral components whose magnitudes are greater than zero, bandwidth along the backplane is saved when transferring data to the MMU 20. As explained previously, the MMU 20 aggregates all the stored time-coincident voltage spectral component and current spectral component values with stored circuit configurations.

Figure 7A:
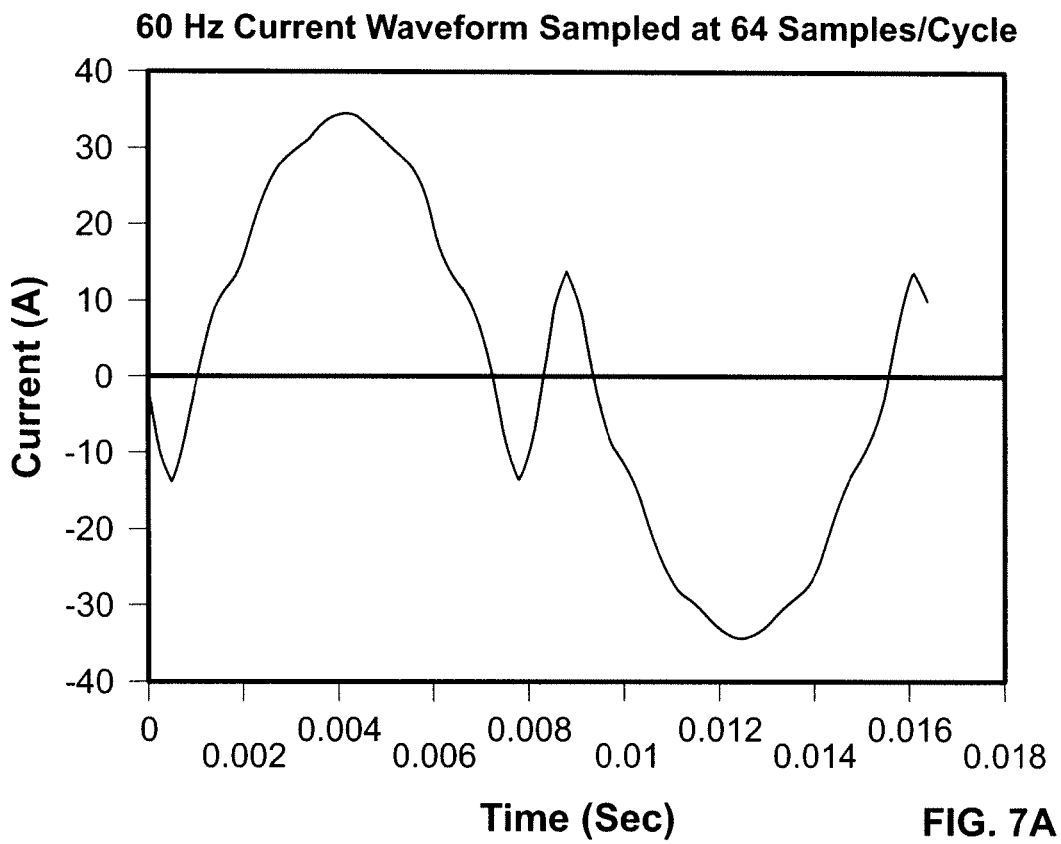
FIGS. 7a and 7b are a graphical example of the operation of the CC of FIG. 5 over one cycle of a power line signal
Figure 7B:
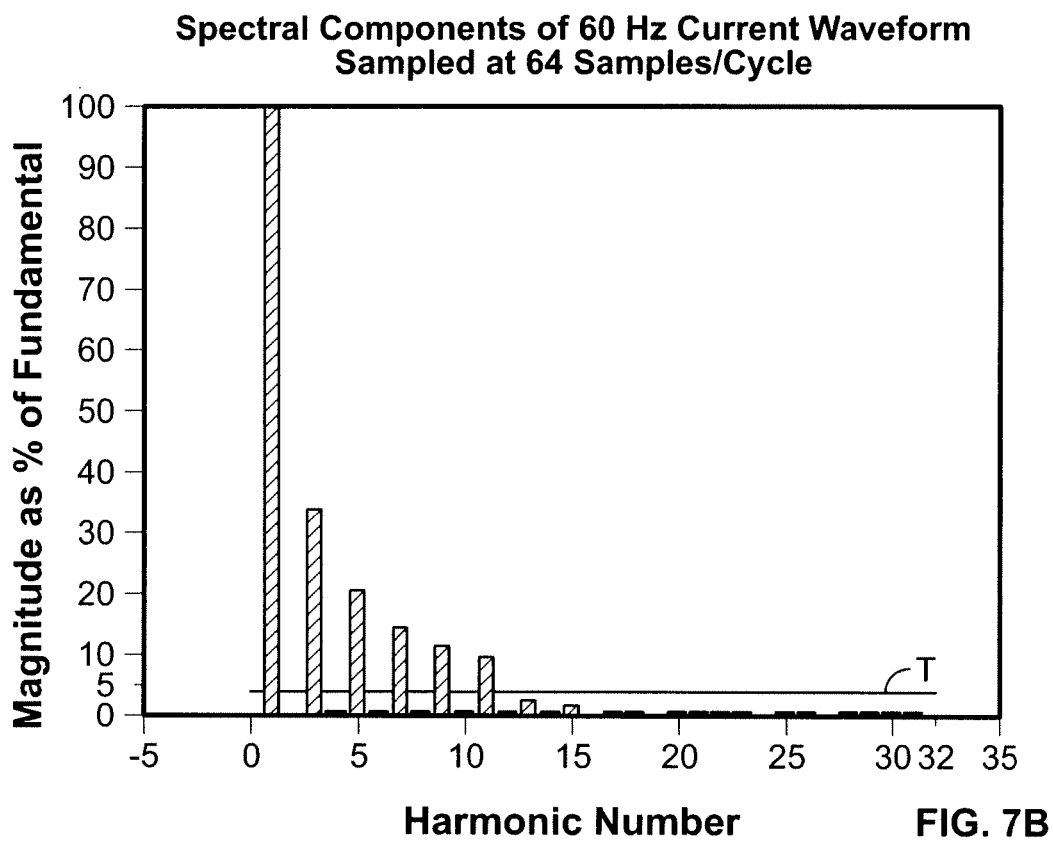

FIGS. 7a and 7b depict an example of the operation of a single input of a CC 26 for one cycle. The waveform being sampled is depicted in FIG. 7a. In this example, the HDM 2 is only sampling at 64 points per cycle, and therefore, 32 spectral components are calculated. The FFT is performed by the CC processor 98, and the magnitude of each harmonic is calculated and graphed as a percentage of the magnitude of the fundamental, as depicted in FIG. 7b. The magnitude of each spectral component is then compared to the threshold value of five percent of the fundamental, represented by the horizontal line T in FIG. 7b. The spectral component values below the threshold value T are set to zero. In the example in FIG. 7b, because only the spectral components with magnitudes greater than zero are transmitted to the MMU 20, only six spectral component values are transmitted to the MMU 20.

Returning to FIG. 2, the user interface 23 containing a display and keypad is connected to the MMU 20 via the user interface port 25 using an RS485 cable. The MMU 20 controls the user interface 23 which, in its most basic form, allows a user to monitor a circuit, program the HDM 2, and test the revenue accuracy of an individual circuit. More options are possible that allow a user to set additional options such as alarms, passwords, etc. In addition to the user interface 23, the HDM 2 supports multiple listener displays 24 by daisy chaining the listener displays 24 to the user interface 23 using RS485 cables. A single listener display 24 is set to a specific branch circuit and displays all programmed parameters and calculated values for the selected branch circuit. Listener displays 24 are ideal in a tenant metering application of an HDM 2 to allow a tenant to remotely monitor the branch circuit supplying power to his or her location while restricting access to the HDM 2 unit.

To initially program the HDM 2 via the user interface 23, the user sets the parameters for the main bus 1 being monitored by the MMU 20, defines each branch circuit, and sets the date and time. All parameters entered into the user interface 23 are stored in the MMU memory 51.

To set the parameters of the main bus 1 being monitored by the MMU 20, the user selects the system configuration of the main bus 1 and defines the voltage inputs 45 and current inputs 46. First, the user selects the system configuration for the main bus 1 by selecting from available configurations such as three-phase, four-wire wye; three-phase, four-wire delta; etc. Next, the user defines each of the voltage inputs 45 for the selected configuration by assigning each input to a phase in the distribution system and setting the ratio of any voltage transducers. If there are no voltage transducers, the ratio is set to 1:1. Finally, the user defines each of the current inputs 46. Each current input 46 must be assigned to the phase it is monitoring on the main bus 1 and the current transducer measuring the current in that phase. The current transducer is further defined by inputting the current transducer's characterization information. When using a CT as the current transducer, the characterization information typically includes at least the current transformer turns ratios.

Figure 8:
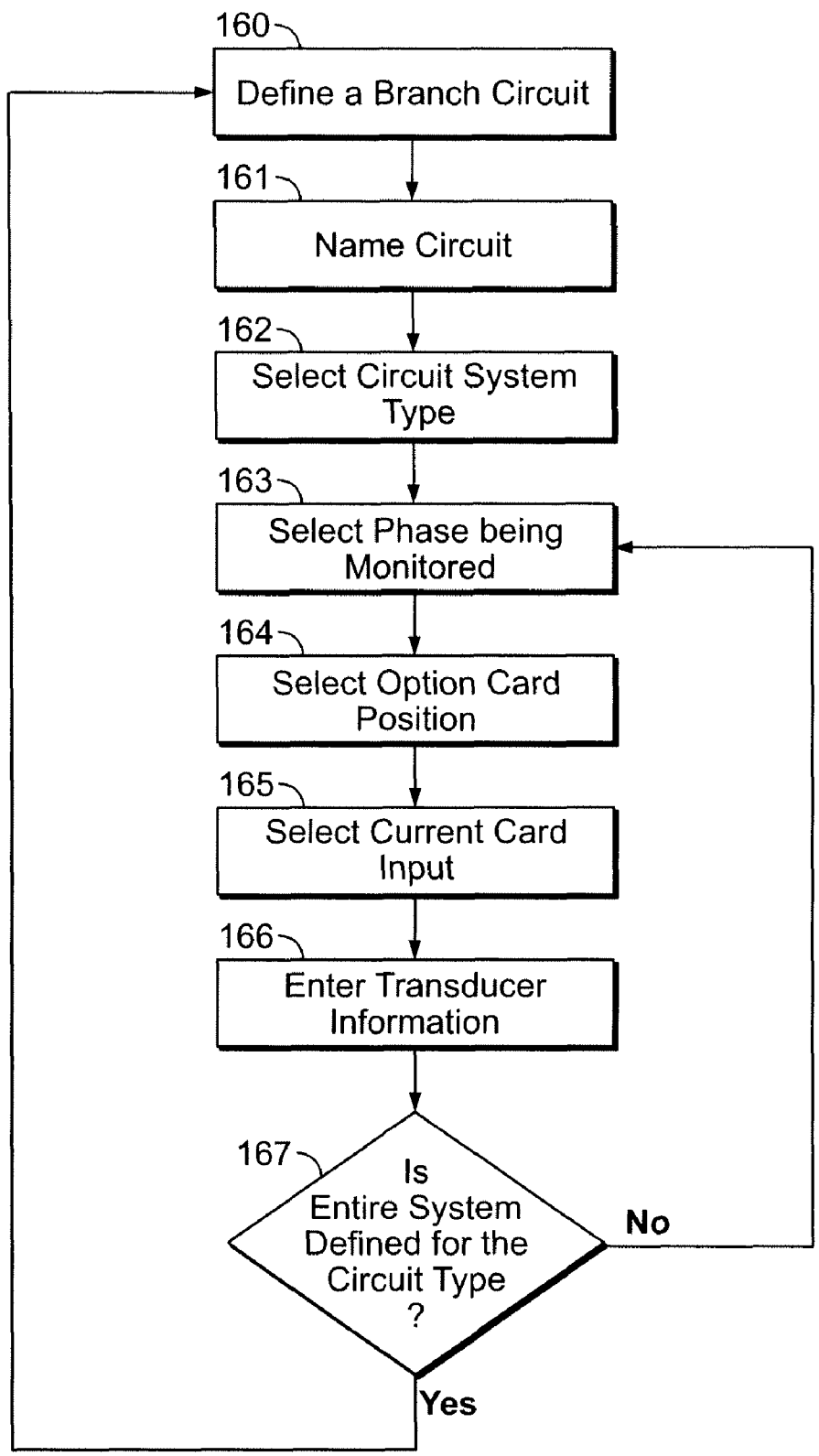
FIG. 8 is a flow chart of the steps to define branch circuit parameters in the MMU of FIG. 3.

The flowchart in FIG. 8 depicts how the user interface 23 is operated to define each branch circuit by setting and storing the branch circuit parameters in the MMU memory 51. When a user enters the routine for defining a branch circuit in step 160, the user first names the circuit in step 161. Next, in step 162, the user selects the branch circuit configuration. The user chooses from single-phase single-wire, single-phase three-wire, three-phase three-wire, etc. As a result, if all eight option cards 21 are CCs 26, the HDM 2 is able to monitor either 64 single-phase single-wire circuits, 32 single phase three-wire circuits, 16 three-phase, three or four-wire branch circuits, or a combination of branch circuit configurations.

In steps 163-166, the user defines the transducers used to monitor the selected branch circuit configuration. The transducers for a given configuration are defined one at a time until all transducers are defined. To define a transducer, the user selects the phase being monitored in step 163 by selecting the MMU voltage input 45 that relates to the same phase in the main bus 1. Next, the user identifies the input the transducer is connected to in steps 164 and 165 by selecting the option card 21 position, labeled OC1-OC8, and the corresponding CC current input 95, labeled I1-I8. Finally, in step 166, the user defines the characteristic information for the corresponding current transducer. After the transducer characteristic information has been inputted, the HDM 2 checks to see if all the transducers are defined for the selected branch circuit configuration in step 167. If the branch circuit is not completely defined, the user then sets the next transducer by repeating the above process beginning at step 163. When the entire branch has been defined, the user then defines another branch circuit in step 160 or returns to the setup menu.

The user sets the date and time to complete the programming of the HDM 2. The date and time are updated by the real time clock 53 that is maintained as part of the microprocessor 50 in the MMU 20. The clock 53 is utilized primarily for time-of-use metering and data logging.

Figure 9:
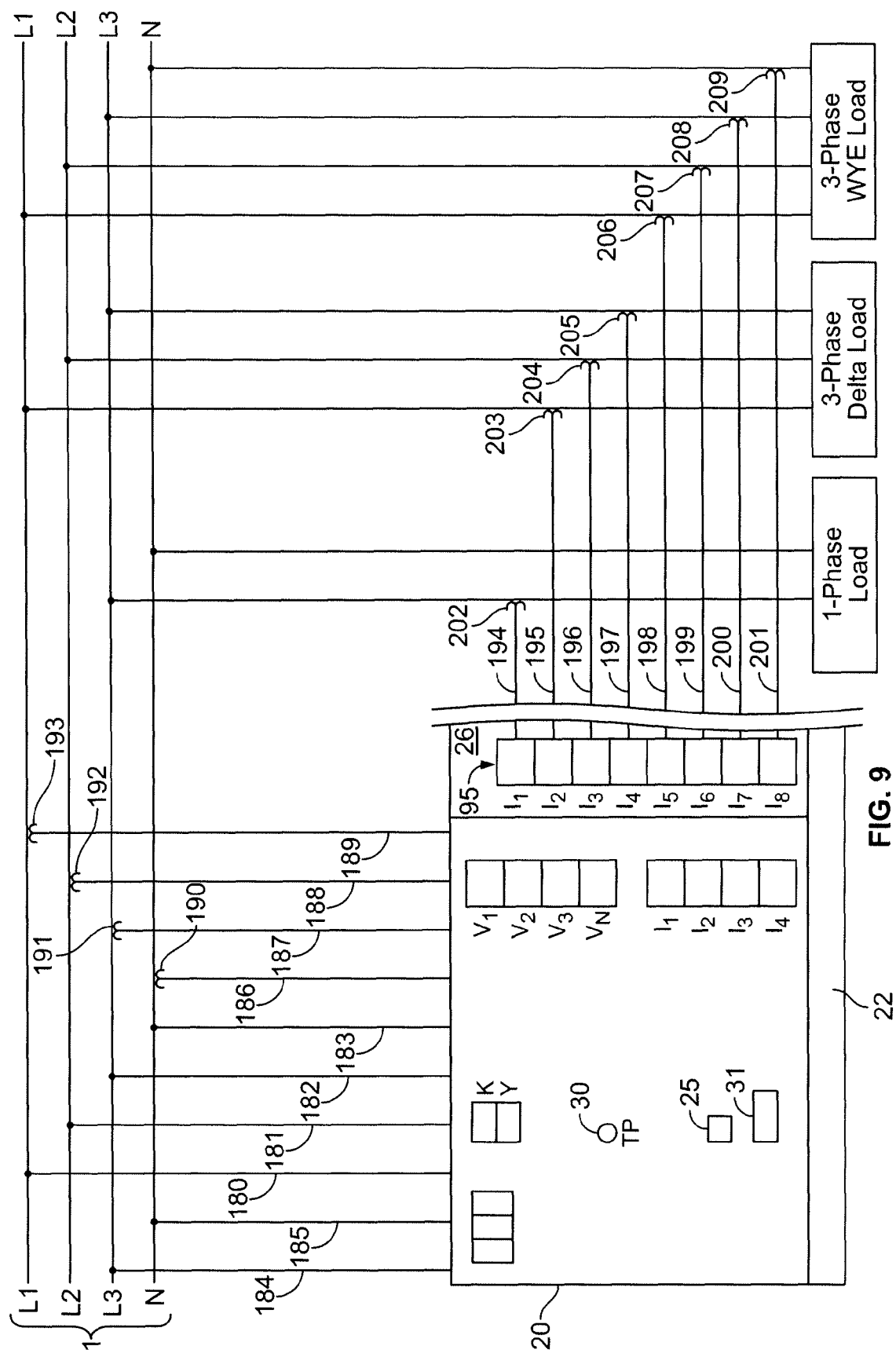
FIG. 9 is a block diagram of a portion of the HDM connected to a power distribution system.

FIG. 9 shows an example of a portion of an HDM 2 connected to a power distribution system with multiple branch circuits. The portion of the HDM 2 shown contains the MMU 20 and a single CC 26 connected along the backplane 22. The power distribution system contains a main bus 1 with conductors L1, L2, L3, N and three branch circuits, each of which contains a different type of load. The MMU 20 is electrically coupled to the main bus 1 to monitor the voltage via lines 180-183 and to receive power for the power supply 52 via lines 184 and 185. The MMU 20 is also coupled to the main bus 1 via lines 186-189 and current transducers 190-193 to monitor the current. The CC current inputs 95, labeled I1-I8, are each coupled to a different conductor of a branch circuit via lines 194-201 and current transducers 202-209 to monitor the current in three branch circuits.

Once the HDM 2 is programmed and in operation, the user operates the user interface 23 to monitor individual circuits. The user selects from the main bus 1 or any of the defined branch circuits. Upon selecting the desired circuit, the user views all programmed circuit configuration information as well as the circuit's real-time readings, demand readings, energy readings, and power analysis values.

The user also operates the user interface 23 to test an individual circuit for revenue accuracy. Upon selecting a desired circuit, the MMU 20 provides a test point 30, as seen in FIG. 2, in the form of an infrared LED that is optically read to verify the HDM's 2 accuracy for the selected circuit.

The power supply 52 is part of the MMU 20 and supplies power to all other components of the HDM 2. In FIG. 2, the power supply 52 accepts an alternating current (AC) or a direct current (DC) input voltage ranging from 100-230 volts from a power source 55. The power supply 52 supplies power directly to all the integrated circuit components 54 of the MMU 20. The power supply is also able to supply power to the user interface 23 and listener displays 24 via the user interface port 25 and to option cards 21 via the backplane 22. Standard voltages distributed along the backplane 22 to operate all electrical components include 12, 5, and 3.3 volts DC.

The MMU 20 uses serial communication via a backplane 22 to communicate with the option cards 21. The use of a backplane 22 allows for easy modular connections of all option cards 21. The backplane 22 has three address lines to identify each option card 21, a "ready" for an options card 21 to indicate it is ready to transmit, an interrupt line, and a control signal line. The backplane 22 can be implemented using serial communication protocols such as SPI, $I^2C$, Uart, or an equivalent.

When the HDM 2 is put in service, the MMU 20 and CCs 26 work to monitor a distribution system as described above. The MMU 20 polls each option card 21 once every cycle. When polled by the MMU 20, an individual CC 26 transmits data representing the spectral component values having magnitudes above the threshold value to the MMU 20 via the backplane 22, and the MMU 20 stores the values in its memory 51. The MMU 20 aggregates the data for each branch circuit using the branch circuit parameters as defined by the user, the stored spectral component values for the branch circuit's inputs, and the stored voltage spectral current values of the main bus that are common to all branch circuits. It is also possible to perform an inverse FFT on the data representing the magnitudes and angles of the current spectral components and aggregate the results with the original stored analog samples from the MMU 20 and the data for each branch circuit. The MMU 20 calculates and logs all the values listed in Table 1 above. An additional data logging module is available as an option card 21 to provide additional memory for increased data logging.

Returning to FIG. 2, the MMU 20 has a single RS-485 communication port 31. The communication port 31 uses an industry standard Modbus protocol which allows the HDM 2 to interface with building management software for remote display or additional processing. Examples of building management software include Powerlogic® Tenant Metering Commercial Edition software, Powerlogic® System Manager™ software, or Powerlogic® ION Enterprise® software. Additional communication ports are available through use of an advanced communication card 27. A standard advanced communication card 27, as depicted in FIG. 2, contains an Ethernet port 32 and an additional RS-485 port 33. Additional advanced communication cards 27 are available with a variety of communication ports such as RS-232, modem, Bluetooth, Zigbee wireless, etc.

As described above, a cost effective approach to an HDM 2 is presented that eliminates redundant hardware and achieves a low cost per metering point. The HDM 2 monitors the voltage common to the power distribution system in a MMU 20 that stores data characterizing the power distribution system and all transducers. The HDM 2 monitors the currents in the branch circuits in CC 26. All monitored voltages and currents are sampled as a result of a control signal produced in the MMU 20. The CC 26 determines the spectral components and compares the magnitudes with a threshold value. Only the spectral component values above the threshold value are transmitted to the MMU 20, where they are stored with the time-coincident voltage spectral components. By allocating the processing of the branch circuit current spectral components to the CCs 26, there is a reduction in the processor burden in the MMU 20. Backplane bandwidth and processor burden are reduced by comparing the spectral components to a threshold value in the CC 26 and only transmitting the data representing the spectral components having magnitudes above the threshold value.

While particular embodiments and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

What is claimed is:

1. A meter for monitoring the electrical power in multiple branch circuits of an AC electrical power distribution system, comprising
a main meter unit monitoring at least one voltage common to said multiple branch circuits and sampling the monitored voltage multiple times in each cycle of the AC power signal, and
multiple current cards receiving a plurality of current inputs from current transducers in the multiple branch circuits, monitoring currents of the multiple branch circuits, sampling the monitored currents multiple times in each cycle of the AC power signal, determining the magnitudes and angles of spectral components of the sampled current, and sending data representing said magnitudes and angles of at least selected spectral components from the current cards to the main meter unit,
said main meter unit storing the voltage samples and the data representing the magnitudes and angles of at least the selected spectral components.

2. The meter of claim 1 in which said main meter unit determines the magnitudes and angles of spectral components of the sampled voltage, and stores data representing said magnitudes and angles of the voltage spectral components.

3. The meter of claim 2 in which said main meter unit stores data characterizing system voltage type, current transducers, and branch circuit configurations of the power distribution system, and calculates the power consumed in each branch circuit using said stored characterizing data along with the stored data representing said magnitudes and angles of the voltage and current spectral components.

4. The meter of claim 1 wherein said current cards determine spectral component magnitudes and angles by performing a Fast Fourier Transform of the sampled current.

5. The meter of claim 1 in which said main meter unit compares the spectral component magnitudes to a predetermined value related to the fundamental frequency, and determines which spectral component magnitudes are greater than said predetermined value.

6. The meter of claim 5 in which said current cards send only data representing the magnitudes and angles of the current spectral components with magnitudes that are in excess of the predetermined value, to the main meter unit.

7. The meter of claim 1 which said current cards monitor currents from multiple transducers in the same branch circuit.

8. The meter of claim 1 in which said main meter unit generates a control signal that represents the times at which the monitored voltage and currents are to be sampled, transmits said control signal to said current cards, and samples said monitored voltage and currents in response to said control signal to produce time coincident samples.

9. The meter of claim 1 wherein a single current card samples currents from multiple branch circuits.

10. The meter of claim 9 wherein said multiple branch circuits whose currents are sampled by said single current card are of different circuit configurations.

11. The meter of claim 1 which includes a common backplane coupling the main metering unit and the multiple current cards, and a single chassis containing the main metering unit, the multiple current cards, and the common backplane.

12. The meter of claim 11 wherein said current cards send the data to the main meter unit via the common backplane.

13. The meter of claim 11 in which said main meter unit generates a control signal that represents the times at which the monitored voltage and currents are to be sampled, and transmits said control signal to the multiple current cards via the common backplane.

14. The meter of claim 1 in which the sampling of said monitored voltage and currents produces time-coincident samples.

15. The meter of claim 1 in which said main meter unit monitors at least one current common to said multiple branch circuits, samples the monitored current common to said multiple branch circuits in the main meter unit, determines the magnitudes and angles of spectral components of the sampled current common to said multiple branch circuits, and stores data representing said magnitudes and angles of the current spectral components common to said multiple branch circuits.

16. A computer program product, comprising one or more non-transitory tangible media having a computer readable program logic embodied therein, the computer readable program logic configured to be executed to implement a method of monitoring the electrical power in multiple branch circuits of an AC electrical power distribution system, the method comprising
monitoring at least one voltage common to said multiple branch circuits using a main meter unit;
monitoring currents of the multiple branch circuits, using multiple current cards that receive a plurality of current inputs from current transducers in the multiple branch circuits;
sampling the monitored voltage in the main meter unit and the monitored currents in the current cards multiple times in each cycle of the AC power signal;
determining the magnitudes and angles of spectral components of the sampled current in the current cards;
sending data representing said magnitudes and angles of at least selected spectral components from the current cards to the main meter unit; and
storing the voltage samples and the data representing the magnitudes and angles of at least the selected spectral components in the main meter unit.

17. The computer program product of claim 16 in which said method includes
determining the magnitudes and angles of spectral components of the sampled voltage in the main meter unit; and
storing data representing said magnitudes and angles of the voltage spectral components in the main meter unit.

18. The computer program product of claim 17 in which said method includes
storing in the main meter unit data characterizing system voltage type, current transducers, and branch circuit configurations of the power distribution system; and
calculating in the main meter unit the power consumed in each branch circuit using said stored characterizing data along with the stored data representing said magnitudes and angles of the voltage and current spectral components.

19. The computer program product of claim 16 in which said method includes said spectral component magnitudes and angles are determined by performing a Fast Fourier Transform of the sampled current in the current cards.

20. The computer program product of claim 16 in which said method includes
comparing the spectral component magnitudes to a predetermined value related to the fundamental frequency; and
determining which spectral component magnitudes are greater than said predetermined value.

21. The computer program product of claim 20 in which said method includes only data representing the magnitudes and angles of the current spectral components with magnitudes that are in excess of the predetermined value are sent to the main meter unit.

22. The computer program product of claim 16 in which said method includes monitoring currents from multiple transducers in the same branch circuit.

23. The computer program product of claim 16 in which said method includes generating in said main meter unit a control signal that represents the times at which the monitored voltage and currents are to be sampled, transmitting said control signal to said current cards, and sampling said monitored voltage and currents is effected in response to said control signal to produce time coincident samples.

24. The computer program product of claim 16 in which said method includes a single current card samples currents from multiple branch circuits.

25. The computer program product of claim 24 in which said method includes multiple branch circuits whose currents are sampled by said single current card are of different circuit configurations.

26. The computer program product of claim 16 in which said method includes a common backplane couples the main metering unit and the multiple current cards, and
a single chassis contains the main metering unit, the multiple current cards, and the common backplane.

27. The computer program product of claim 26 in which said method includes data that is sent via the common backplane from the current cards to the main meter unit.

28. The computer program product of claim 26 in which said method includes
generating in said meter unit a control signal that represents the times at which the monitored voltage and currents are to be sampled; and
transmitting said control signal to the multiple current cards via the common backplane.

29. The computer program product of claim 16 in which said method includes the sampling of said monitored voltage and currents produces time-coincident samples.

30. The computer program product of claim 16 in which said method includes
monitoring at least one current common to said multiple branch circuits using a main meter unit;
sampling the monitored current common to said multiple branch circuits in the main meter unit;
determining the magnitudes and angles of spectral components of the sampled current common to said multiple branch circuits in the main meter unit; and
storing data representing said magnitudes and angles of the current spectral components common to said multiple branch circuits in the main meter unit.

* * * * *